US011088310B2

(12) United States Patent
Rubin et al.

(10) Patent No.: US 11,088,310 B2
(45) Date of Patent: Aug. 10, 2021

(54) THROUGH-SILICON-VIA FABRICATION IN PLANAR QUANTUM DEVICES

(71) Applicant: International Business Machines Corporation, Armonk, NY (US)

(72) Inventors: Joshua M. Rubin, Albany, NY (US); Jared Barney Hertzberg, Yorktown Heights, NY (US); Sami Rosenblatt, White Plains, NY (US); Vivekananda P. Adiga, Ossining, NY (US); Markus Brink, White Plains, NY (US); Arvind Kumar, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 72 days.

(21) Appl. No.: 16/396,992

(22) Filed: Apr. 29, 2019

(65) Prior Publication Data

US 2020/0343434 A1    Oct. 29, 2020

(51) Int. Cl.
*H01L 39/02* (2006.01)
*H01L 21/3205* (2006.01)
(Continued)

(52) U.S. Cl.
CPC ...... *H01L 39/025* (2013.01); *H01L 21/32058* (2013.01); *H01L 21/76898* (2013.01);
(Continued)

(58) Field of Classification Search
USPC ........................................................ 427/62
See application file for complete search history.

(56) References Cited

U.S. PATENT DOCUMENTS

| 7,420,127 B2 | 9/2008 | Asami et al. ............ H05K 1/02 |
| 8,580,682 B2 * | 11/2013 | Yang ................ H01L 21/76898 |
| | | 438/667 |

(Continued)

FOREIGN PATENT DOCUMENTS

| CN | 107564868 A | 1/2018 | ............ H01L 23/31 |
| CN | 105468821 B | 11/2018 | ............ G06F 17/50 |

OTHER PUBLICATIONS

Tao et al., "Micro-fabricated Surface Electrode Ion Trap with 3D-TSV Integration for Scalable Quantum Computing", 2019 Electron Devices Technology and Manufacturing Conference (EDTM), IEEE, Mar. 12, 2019, pp. 300-302.

(Continued)

*Primary Examiner* — Brian K Talbot
(74) *Attorney, Agent, or Firm* — Garg Law Firm, PLLC; Rakesh Garg; Douglas Pearson

(57) ABSTRACT

On a first superconducting layer deposited on a first surface of a substrate, a first component of a resonator is pattered. On a second superconducting layer deposited on a second surface of the substrate, a second component of the resonator is patterned. The first surface and the second surface are disposed relative to each other in a non-co-planar disposition. In the substrate, a recess is created, the recess extending from the first superconducting layer to the second superconducting layer. On an inner surface of the recess, a third superconducting layer is deposited, the third superconducting layer forming a superconducting path between the first superconducting layer and the second superconducting layer. Excess material of the third superconducting layer is removed from the first surface and the second surface, forming a completed through-silicon via (TSV).

17 Claims, 14 Drawing Sheets

(51) Int. Cl.
  *H01L 21/768* (2006.01)
  *H01L 23/48* (2006.01)
  *H01L 23/532* (2006.01)
  *H01L 39/22* (2006.01)
  *H01L 39/24* (2006.01)
(52) U.S. Cl.
  CPC ...... *H01L 23/481* (2013.01); *H01L 23/53285* (2013.01); *H01L 39/223* (2013.01); *H01L 39/2493* (2013.01)

(56) References Cited

U.S. PATENT DOCUMENTS

| | | | |
|---|---|---|---|
| 9,953,269 B2 | 4/2018 | Chow et al. | H01L 29/06 |
| 10,121,754 B2 | 11/2018 | Oliver et al. | H05K 1/02 |
| 10,243,132 B1* | 3/2019 | Rosenblatt | H01L 39/223 |
| 10,305,015 B1* | 5/2019 | Brink | G06N 10/00 |
| 2014/0302671 A1* | 10/2014 | Duong | H01L 21/76841 |
| | | | 438/653 |
| 2017/0177534 A1 | 6/2017 | Mohseni et al. | |
| 2017/0373044 A1* | 12/2017 | Das | H01L 23/5226 |
| 2018/0102470 A1* | 4/2018 | Das | H01L 23/5384 |
| 2018/0137430 A1 | 5/2018 | Chow et al. | |
| 2018/0247974 A1* | 8/2018 | Oliver | H01L 27/18 |
| 2019/0165237 A1* | 5/2019 | Hertzberg | H01L 21/76877 |
| 2019/0363128 A1* | 11/2019 | Rosenblatt | G06N 10/00 |

OTHER PUBLICATIONS

International Searching Authority, PCT/EP2020/057766, dated Jun. 18, 2020.

\* cited by examiner

THROUGH-SILICON-VIA FABRICATION IN PLANAR QUANTUM DEVICES

TECHNICAL FIELD

The present invention relates generally to a quantum processor, a fabrication method, and superconductor device fabrication system for fabricating a low loss architecture in planar quantum devices. More particularly, the present invention relates to a device, method, and system for through-silicon-via fabrication in planar quantum devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at a fundamental level. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

Superconducting devices such as qubits are fabricated using superconducting and semiconductor materials in known semiconductor fabrication techniques. A superconducting device generally uses one or more layers of different materials to implement the device properties and function. A layer of material can be superconductive, conductive, semiconductive, insulating, resistive, inductive, capacitive, or have any number of other properties. Different layers of materials may have to be formed using different methods, given the nature of the material, the shape, size or placement of the material, other materials adjacent to the material, and many other considerations.

Superconducting devices are often planar, i.e., where the superconductor structures are fabricated on one plane. A non-planar device is a three-dimensional (3D) device where some of the structures are formed above or below a given plane of fabrication.

A q-processor is implemented as a set of more than one qubit. The qubits can be fabricated as a lattice of co-planar devices on a single fabrication plane.

SUMMARY

The illustrative embodiments provide a superconducting device, and a method and system of fabrication therefor. In a fabrication method for fabricating a superconducting device, an embodiment patterns, on a first superconducting layer deposited on a first surface of a substrate, a first component of a resonator. An embodiment patterns, on a second superconducting layer deposited on a second surface of the substrate, a second component of the resonator, wherein the first surface and the second surface are disposed relative to each other in a non-co-planar disposition. An embodiment creates, in the substrate, a recess, the recess extending from the first superconducting layer to the second superconducting layer. An embodiment deposits, on an inner surface of the recess, a third superconducting layer, the third superconducting layer forming a superconducting path between the first superconducting layer and the second superconducting layer. An embodiment removes, from the first surface and the second surface, forming a completed through-silicon via (TSV), excess material of the third superconducting layer. Thus, the embodiment provides a manner of fabricating a TSV in a coplanar superconducting quantum processing circuit.

Another embodiment deposits, on the patterned first surface, a first protective layer. An embodiment deposits, on the patterned second surface, a second protective layer. An embodiment performs the creating such that the recess extends from the first protective layer to the second protective layer. Thus, the embodiment provides a manner of creating a recess extending from the first protective layer to the second protective layer during TSV fabrication.

In another embodiment, the first protective layer comprises an oxide layer. Thus, the embodiment provides more detail regarding a manner of creating a recess extending from the first protective layer to the second protective layer during TSV fabrication.

Another embodiment etches, within the substrate portion of the recess, an undercut region, wherein a diameter of the undercut region is greater than a diameter of the recess at the first superconducting layer. Thus, the embodiment provides a manner of providing an undercut region in a TSV.

Another embodiment deposits, on the second protective layer prior to creating the recess, an etch stop layer. An embodiment removes, from the second protective layer after etching the undercut region, the etch stop layer. Thus, the embodiment provides a manner of limiting etching during TSV fabrication.

In another embodiment, the etch stop layer comprises a silicon nitride layer. Thus, the embodiment provides more detail of a manner of limiting etching during TSV fabrication.

Another embodiment further deposits the third superconducting layer on the first protective layer and the second protective layer. Thus, the embodiment provides an additional region of a superconducting layer during TSV fabrication.

Another embodiment further removes the third superconducting layer from the first protective layer and the second protective layer. Thus, the embodiment provides for removal of the third superconducting layer once no longer used during TSV fabrication.

Another embodiment further removes, from the first patterned surface and the second patterned surface, the first protective layer and the second protective layer. Thus, the embodiment provides for removal of the first protective layer and the second protective layer once used during TSV fabrication.

Another embodiment etches, prior to removing the first protective layer and the second protective layer, a portion of the third superconducting layer, the portion occupying the recess in the protective layer. Thus, the embodiment removes a portion of the third superconducting layer from a region around the TSV during TSV fabrication.

In another embodiment, the etching is performed using an isotropic silicon dry etch process. Thus, the embodiment provides more detail regarding a manner of etching during TSV fabrication.

In another embodiment, each of the first superconducting layer, the second superconducting layer, and the third superconducting layer, comprises a titanium nitride layer. Thus, the embodiment provides more detail regarding a material used during TSV fabrication.

In another embodiment, the removing uses an etching process. Thus, the embodiment provides more detail regarding a process used during TSV fabrication.

In another embodiment, the completed TSV is a hollow superconductor. Thus, the embodiment provides more detail regarding a property of the completed TSV.

In another embodiment, the first component of the resonator is an inductive element, and the inductive element and a qubit are disposed on the same surface. Thus, the embodiment provides more detail regarding component locations of a superconducting device.

In another embodiment, the first component of the resonator is a capacitive element, and the capacitive element and a qubit are disposed on the same surface. Thus, the embodiment provides more detail regarding component locations of a superconducting device.

In another embodiment, the first component of the resonator is a conductive pad, the conductive pad and a qubit are disposed on the same surface, and the inductive element and the capacitive element of the resonator are disposed on the opposite surface. Thus, the embodiment provides more detail regarding component locations of a superconducting device.

An embodiment includes a quantum device. An embodiment includes a set of qubits disposed on a first surface of a substrate. An embodiment includes a readout circuit distributed across the first surface and a second surface of the substrate such that a first component of the readout circuit on the first surface is superconductively coupled to a second component of the readout circuit on the second surface through a through silicon via (TSV) wherein the TSV comprises a hollow superconducting layer deposited on a recess through the substrate. Thus, an embodiment provides a quantum device including a TSV.

In another embodiment of the quantum device, the first component of the resonator is an inductive element, and the inductive element and a qubit are disposed on the same surface. Thus, an embodiment provides additional detail of the function and disposition of elements of the quantum device.

In another embodiment of the quantum device, the first component of the resonator is a capacitive element, and the capacitive element and a qubit are disposed on the same surface. Thus, an embodiment provides additional detail of the function and disposition of elements of the quantum device.

In another embodiment of the quantum device, the first component of the resonator is a conductive pad, the conductive pad and a qubit are disposed on the same surface, and the inductive element and the capacitive element of the resonator are disposed on the opposite surface. Thus, an embodiment provides additional detail of the function and disposition of elements of the quantum device.

In another embodiment of the quantum device, the TSV includes an undercut region. Thus, an embodiment provides additional detail of the disposition of an element of the quantum device.

In another embodiment of the quantum device, the TSV is filled with a non-superconducting material. Thus, an embodiment provides additional detail of the composition of an element of the quantum device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
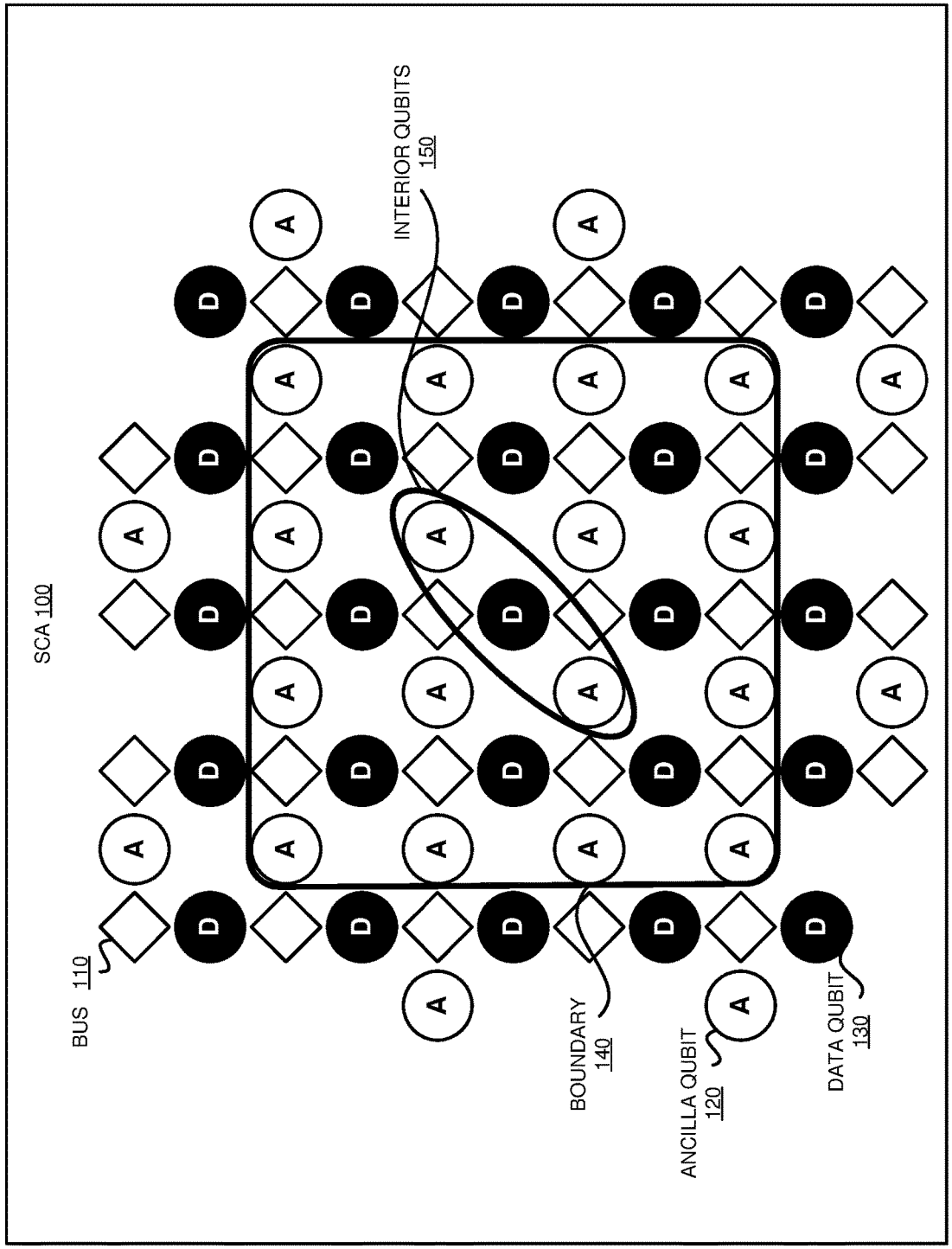
FIG. 1 depicts an example Surface Code Architecture (SCA) illustrating a problem that can be solved using an illustrative embodiment.

FIG. 1 depicts an example Surface Code Architecture (SCA) illustrating a problem that can be solved using an illustrative embodiment. Superconducting qubit architectures such as SCA 100 arrange a number of qubits, such as ancilla qubit 120 and data qubit 130, in a lattice formation in a single plane. The qubits are made to perform logical operations among one another via resonant lines 110 (also known as buses). The result of logical operations is determined from the state-value of each qubit. This is measured via a readout resonator circuit attached to each qubit. (not shown in FIG. 1).

The quantum state of a qubit 120 is read using read lines. As can be seen, all of bus 110 are coplanar (in the same plane) with qubits 120 and 130. As recognized by the illustrative embodiments, SCA 100 only allows coplanar read lines to read qubits 120 and 130 that lie on the periphery of SCA 100. To read qubits, such as interior qubits 150, which lie inside boundary 140 of SCA 100, a read line would have to be connected in a plane that is orthogonal to the plane of fabrication of SCA 100, making the fabrication of SCA 100 a three-dimensional fabrication.

This manner of accessing interior qubits 150 for reading the qubit's quantum state is known as "breaking the plane". The illustrative embodiments recognize that breaking the plane due to the need of reading interior qubits 150 in SCA 100 requires a three-dimensional integration methodology that is adapted for quantum processor hardware, as opposed to the three-dimensional integration methodology previously developed for Complementary Metal Oxide Semiconductor (CMOS) chip fabrication. In particular, techniques developed for CMOS fabrication lack support for the superconductive wiring, 100-nanometer-scale Josephson tunnel junctions, and signal routing and impedance matching needed in a quantum processor. In addition, the amorphous dielectric materials used in CMOS fabrication are prone to high microwave loss at the milli-Kelvin temperatures required for superconductivity, resulting in poor qubit coherence.

The illustrative embodiments recognize that there are other advantages to breaking the plane. Structures that, in a planar arrangement, were located on the periphery of an SCA, can be relocated to be above or below the lattice of qubits, thus reducing circuit area and improving routability for input to and output from qubits.

Thus, the illustrative embodiments recognize that what is needed in the art is a signal path technology that can transport a superconductive signal from one surface of a substrate to another, without using amorphous dielectric materials, that can be constructed as part of a fabrication process of a quantum processor.

The illustrative embodiments used to describe the invention generally address and solve the above-described problems and other related problems by providing a through-silicon-via for use in planar quantum devices. The illustrative embodiments also provide a fabrication method and system for through-silicon-via fabrication in planar quantum devices.

An embodiment provides a through-silicon-via (TSV). A TSV provides a conduction path through a substrate from one surface of the substrate to another surface of the substrate, to allow for three-dimensional integration of microelectronic structures. A similar through-via structure can also be fabricated in a substrate other than silicon—for example, glass, sapphire, or quartz—and is included in the term through-silicon-via as used herein. A TSV transfers signal from one surface to another via the conduction path.

Because a TSV transfers signal between substrate surfaces, using a TSV allows placement of some structures in a quantum design on one substrate surface and placement of other structures in a quantum design on another substrate surface. A quantum design is a fabricated circuitry in which at least some components are quantum components formed using superconducting materials and operating in a cryogenic temperature range. In a particular but non-limiting example, using a TSV allows relocating all or a portion of a readout resonator for a qubit to a location on an opposite substrate surface from the qubit, thus breaking the plane in a different direction than the conventional breaking of the plane—the TSV allows breaking the plane in a direction towards and through the substrate, whereas the conventional approaches break the plane in a direction away from the substrate. Such relocation also reduces circuit area and improves routability for input to and output from qubits.

In addition, as quantum circuits enlarge to include more qubits, such circuits are subject to more modes of unwanted parasitic microwave resonance. These modes, also called box modes, result in electromagnetic signals within a substrate, interfering with reading out qubits. Because a TSV transfers signal between substrate surfaces, the illustrative embodiments recognize that a TSV can also shunt ground planes between substrate surfaces, thus suppressing box modes.

As well, the use of a lossy material such as an amorphous dielectric material is undesirable in a quantum environment, particularly in conducting signal from one substrate surface to another. Superconducting qubits are non-linear microwave resonators formed by the Josephson inductance of a tunnel junction and its shunt capacitance. Since part of the resonators' electrical field interacts with the environment around it, if there are entities that cause losses, such as two level systems in dielectrics, then decoherence can occur. As a result, quantum behavior is lost, and consequently information is lost. Thus, using a TSV fabricated from a superconducting material, connected to superconducting layers already present on substrate surfaces, minimizes signal loss in quantum applications.

Thus, using a superconducting TSV meets the need recognized by the illustrative embodiments, in providing a signal path technology that can superconductively transport a signal from one surface of a substrate to another. A superconducting TSV according to the illustrative embodiments is fabricated without using amorphous dielectric materials, improves signal quality, and can be constructed as part of a fabrication process of a quantum processor.

Another embodiment provides a fabrication method for the superconducting TSV, such that the method can be implemented as a software application. The application implementing a fabrication method embodiment can be configured to operate in conjunction with an existing superconducting fabrication system—such as a lithography system. A reference to a TSV in the context of an embodiment is to be understood as a reference to a superconducting TSV, unless expressly distinguished where used.

For the clarity of the description, and without implying any limitation thereto, the illustrative embodiments are described using an example number of qubits arranged in a lattice. An embodiment can be implemented with a different number of qubits, different arrangements in a lattice, a superconducting device other than a qubit, or some combination thereof, within the scope of the illustrative embodiments. An embodiment can be implemented to similarly improve other coplanar superconducting fabrications where transferring a signal from one surface to another is desired.

Furthermore, a simplified diagram of the example TSV is used in the figures and the illustrative embodiments. In an actual fabrication of a TSV, additional structures that are not shown or described herein, or structures different from those shown and described herein, may be present without departing the scope of the illustrative embodiments. Similarly, within the scope of the illustrative embodiments, a shown or described structure in the example TSV may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical superconducting device, e.g., a qubit, only as an example. The steps described by the various illustrative embodiments can be adapted for fabricating a variety of TSV structures in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
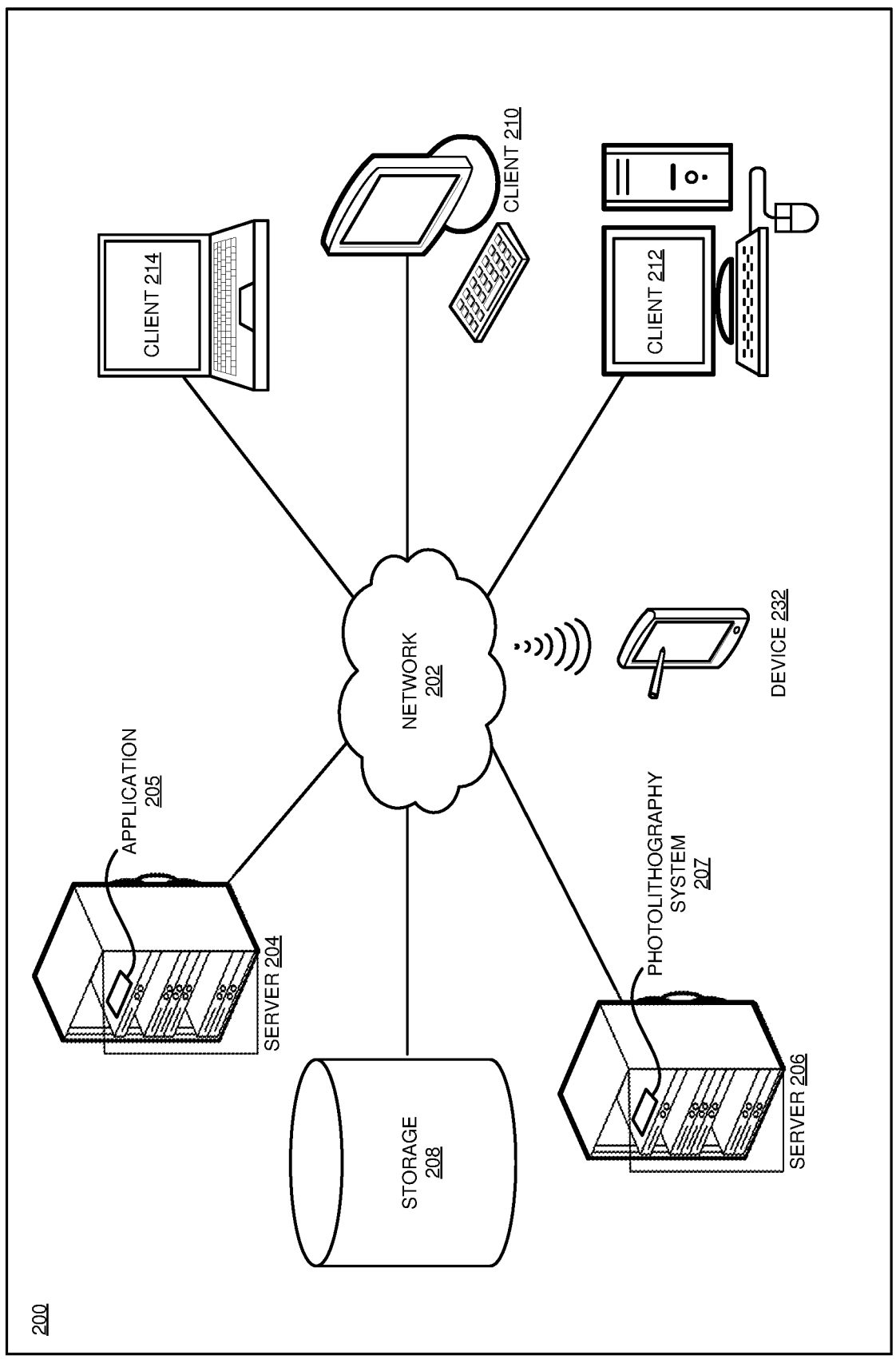
FIG. 2 depicts a block diagram of a network of data processing systems in which illustrative embodiments may be implemented.

FIG. 2 depicts a block diagram of a network of data processing systems in which illustrative embodiments may be implemented. Data processing environment 200 is a network of computers in which the illustrative embodiments may be implemented. Data processing environment 200 includes network 202. Network 202 is the medium used to provide communications links between various devices and computers connected together within data processing environment 200. Network 202 may include connections, such as wire, wireless communication links, or fiber optic cables.

Clients or servers are only example roles of certain data processing systems connected to network 202 and are not intended to exclude other configurations or roles for these data processing systems. Server 204 and server 206 couple to network 202 along with storage unit 208. Software applications may execute on any computer in data processing environment 200. Clients 210, 212, and 214 are also coupled to network 202. A data processing system, such as server 204 or 206, or client 210, 212, or 214 may contain data and may have software applications or software tools executing thereon.

Only as an example, and without implying any limitation to such architecture, FIG. 2 depicts certain components that are usable in an example implementation of an embodiment. For example, servers 204 and 206, and clients 210, 212, 214, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 204, 206, 210, 212, and 214 also represent example nodes in a cluster, partitions, and other configurations suitable for implementing an embodiment.

Device 232 is an example of a device described herein. For example, device 232 can take the form of a smartphone, a tablet computer, a laptop computer, client 210 in a stationary or a portable form, a wearable computing device, or any other suitable device. Any software application described as executing in another data processing system in FIG. 2 can be configured to execute in device 232 in a similar manner. Any data or information stored or produced in another data processing system in FIG. 2 can be configured to be stored or produced in device 232 in a similar manner.

Application 205 implements an embodiment described herein. Photolithography system 207 is any suitable system for fabricating a quantum device. Application 205 provides instructions to system 207 for fabricating the locations on a quantum device where structures can be positioned, and materials can be deposited and removed, or a combination thereof, in a manner described herein.

Servers 204 and 206, storage unit 208, and clients 210, 212, and 214 may couple to network 202 using wired connections, wireless communication protocols, or other suitable data connectivity. Clients 210, 212, and 214 may be, for example, personal computers or network computers.

In the depicted example, server 204 may provide data, such as boot files, operating system images, and applications to clients 210, 212, and 214. Clients 210, 212, and 214 may be clients to server 204 in this example. Clients 210, 212, 214, or some combination thereof, may include their own data, boot files, operating system images, and applications. Data processing environment 200 may include additional servers, clients, and other devices that are not shown.

In the depicted example, data processing environment 200 may be the Internet. Network 202 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 200 also may be implemented as a number of different types of networks, such as for example, an intranet, a local area network (LAN), or a wide area network (WAN). FIG. 2 is intended as an example, and not as an architectural limitation for the different illustrative embodiments.

Among other uses, data processing environment 200 may be used for implementing a client-server environment in which the illustrative embodiments may be implemented. A client-server environment enables software applications and data to be distributed across a network such that an application functions by using the interactivity between a client data processing system and a server data processing system. Data processing environment 200 may also employ a service oriented architecture where interoperable software components distributed across a network may be packaged together as coherent business applications.

Figure 3:
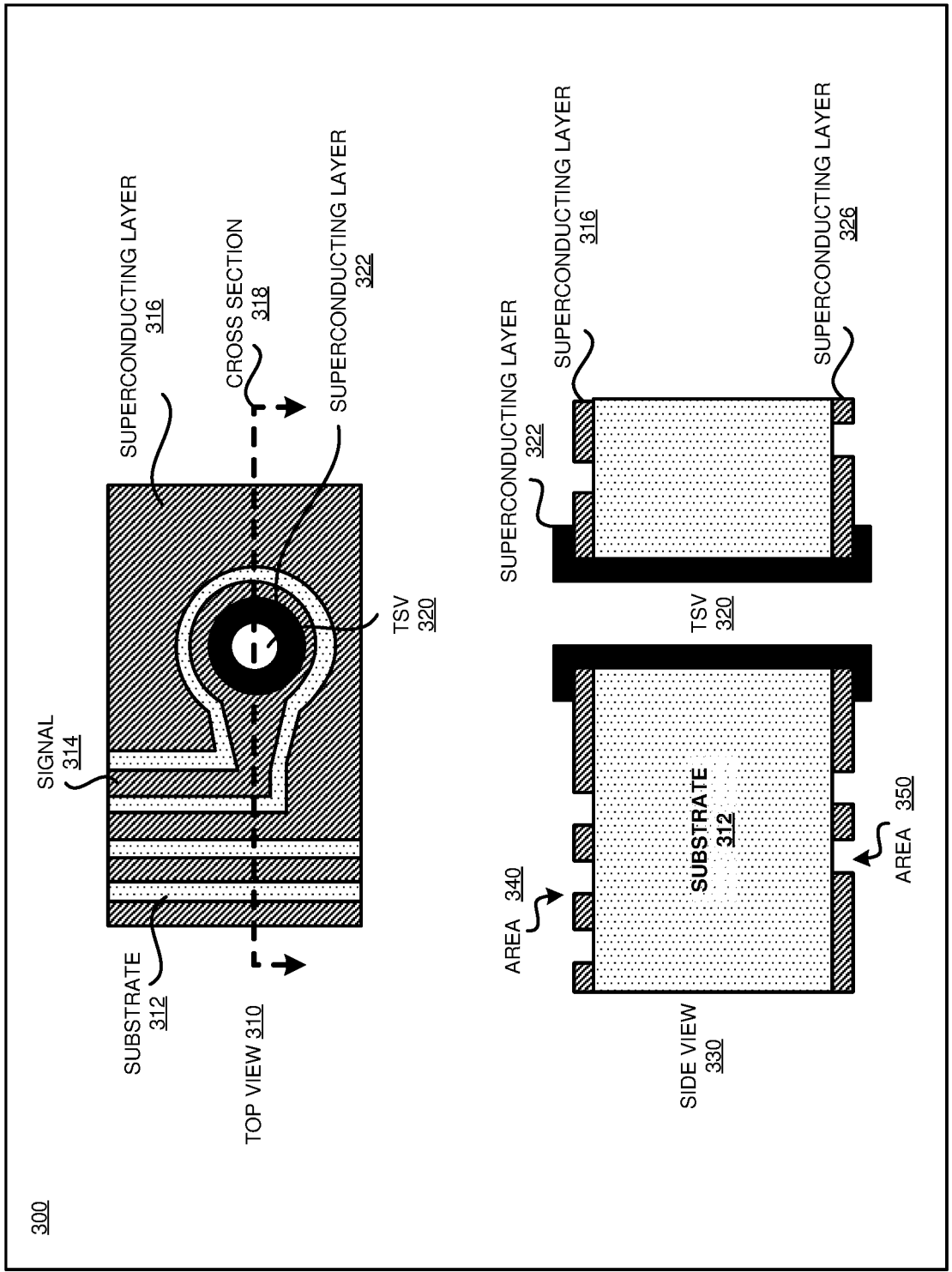
FIG. 3 depicts top and side views of a portion of an example quantum circuit, including a TSV, that can be fabricated in accordance with an illustrative embodiment.

FIG. 3 depicts top and side views of a portion of an example quantum circuit, including a TSV, that can be fabricated in accordance with an illustrative embodiment.

Top view 310 depicts planar quantum circuit 300, as seen from above the circuit. Top view 310 depicts substrate 312, superconducting layer 316 parallel to substrate 312, and superconducting layer 322 lining TSV 320. Signal 314 proceeds along superconducting layer 316 and superconducting layer 322 to the opposite surface of substrate 312.

Side view 330 depicts a cross section of planar quantum circuit 300, along cross section 318 of top view 310. Side view 330 depicts substrate 312, superconducting layer 316 parallel to substrate 312, and superconducting layer 322 lining TSV 320. As well, superconducting layer 326 is disposed on the opposite side of substrate 312 and substantially parallel to superconducting layer 316. Superconducting layers 316, 326, and 322 can be the same or different materials.

Side view 330 also depicts area 340, on one surface of substrate 312, and area 350, on the opposite surface of substrate 312. Area 340 includes a lattice of qubits and bus resonators. Area 350 includes readout resonators for use in providing input/output for the qubits in area 340. TSV transfers an electrical signal from a qubit in area 340 to a corresponding readout resonator in area 350.

Figure 4:
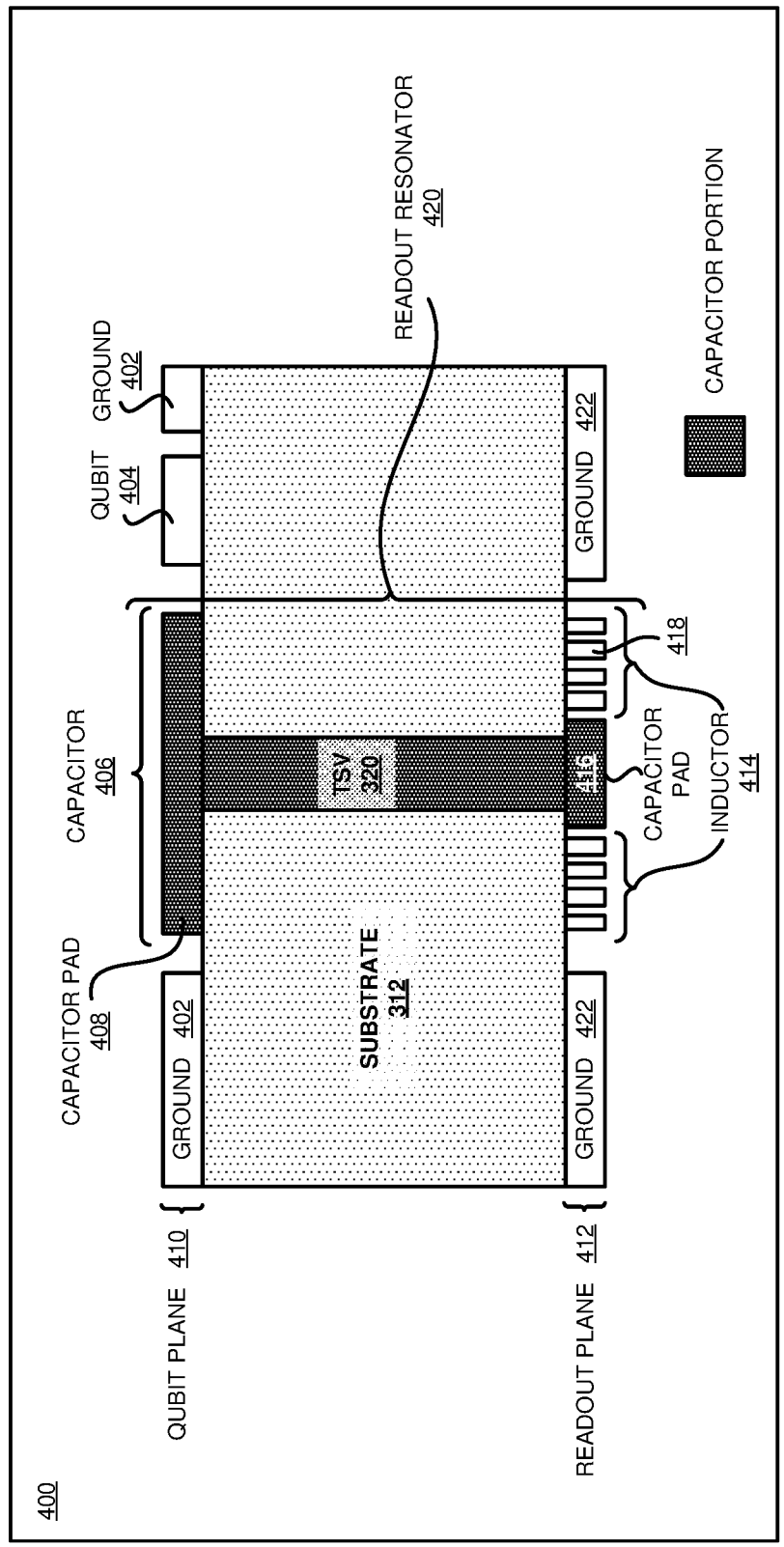
FIG. 4 depicts a cross-sectional view of a portion of the qubit plane and readout plane of an example planar quantum circuit, including a TSV, that can be fabricated in accordance with an illustrative embodiment.

FIG. 4 depicts a cross-sectional view of a portion of the qubit plane and readout plane of an example planar quantum circuit, including a TSV, that can be fabricated in accordance with an illustrative embodiment. Substrate 312 and TSV 320 are the same as Substrate 312 and TSV 320 in FIG. 3.

Consider two qubits, qubit 1 and qubit 2, coupled by a bus resonator. A bus resonator permits exchange of logical quantum information between one qubit and another qubit, so that an entangling gate operation can be performed on the two qubits. Qubits can also be coupled without using a bus resonator—for example, using direct capacitive coupling. The two qubits are each coupled to a readout resonator. Each qubit includes a Josephson junction and a capacitor. Within each bus resonator and readout resonator are planar capacitors, planar inductors, waveguide elements, or other elements incorporating inductance and capacitance.

FIG. 4 depicts components of readout resonator 420, as well as surrounding elements. Readout resonator 420 includes capacitor 406, which includes capacitor pads 408 and 416, TSV 320, and inductor 414. Inductor 414 includes spiral coil 418, an inductive element. Spiral coil 418 is the inductive portion of readout resonator 420, but readout resonator 420 is not limited to spiral coil 418, and another structure can be used as an inductor instead of or in addition to spiral coil 418. TSV 320 attaches to both capacitor pad 416 and to capacitor pad 408. TSV 320, formed through substrate 312, physically and electrically connects qubit plane 410 to readout plane 412. Qubit plane 410 and readout plane 412 are formed on opposite sides/surfaces of substrate 312. In some implementations, there can be one or more layers of materials between qubit plane 410 and substrate 312, and there can be one or more layers of materials between readout plane 412 and substrate 312. Substrate 312 can be a silicon substrate, sapphire substrates, silicon-on-insulator substrate, or any combination thereof. Although not shown for simplicity, ground 402 of qubit plane 410 can be electrically and physically connected to ground 422 of readout plane 412 by multiple interconnects such that the grounds 402 and 422 are maintained at the same potential (or nearly the same potential).

The arrangement of readout resonator components depicted in FIG. 4 is only one example of possible readout resonator component arrangements. An inductive portion of a readout resonator can be disposed on either qubit plane 410 or readout plane 412 or both. A capacitive portion of a readout resonator can be disposed on either qubit plane 410 or readout plane 412 or both. Alternatively, an entire readout resonator, including an inductive portion and a capacitive portion, can be disposed on either qubit plane 410 or readout plane 412 and terminated by TSV 320.

Figure 5:
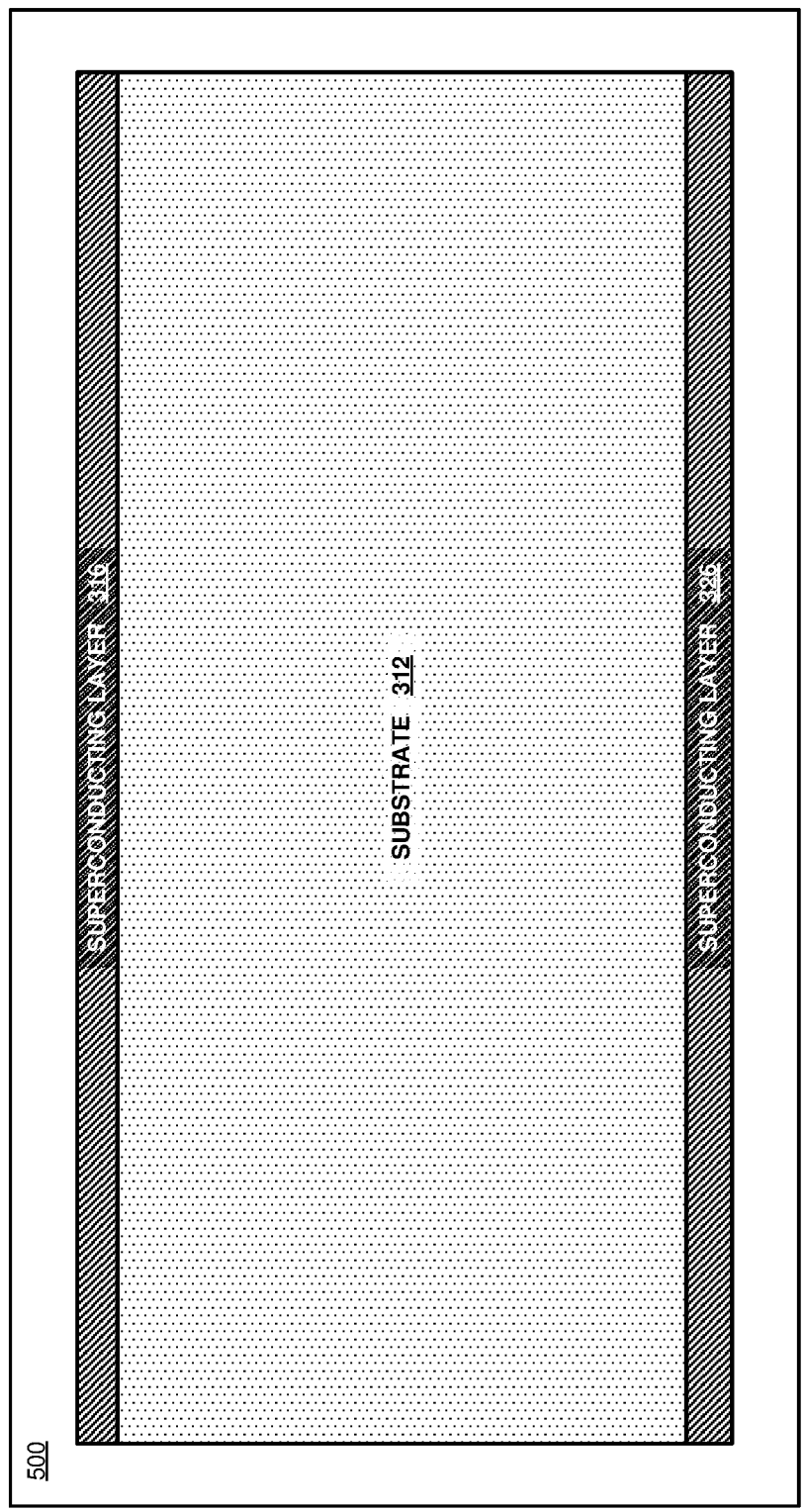
FIG. 5 depicts a step in a fabrication process for through-silicon-via fabrication in planar quantum devices in accordance with an illustrative embodiment.

FIG. 5 depicts a step in a fabrication process for through-silicon-via fabrication in planar quantum devices in accordance with an illustrative embodiment. Substrate 312 and superconducting layers 316 and 326 are the same as substrate 312 and superconducting layers 316 and 326 in FIG. 3.

In particular, FIG. 5 depicts structure 500, including substrate 312. An embodiment has used a deposition process to deposit superconducting layers 316 and 326 onto substrate 312. Superconducting layers 316 and 326 can be a material such as titanium nitride (TiN). Another nitride material, such as one including niobium nitride, aluminum nitride, or tantalum nitride, or non-nitride material, such as one including niobium, aluminum, or tantalum, can also be used as a superconducting layer. A multi-layer stack of superconducting material can also be used. However, some materials are better suited for the particular operating temperatures of some quantum circuits.

Figure 6:
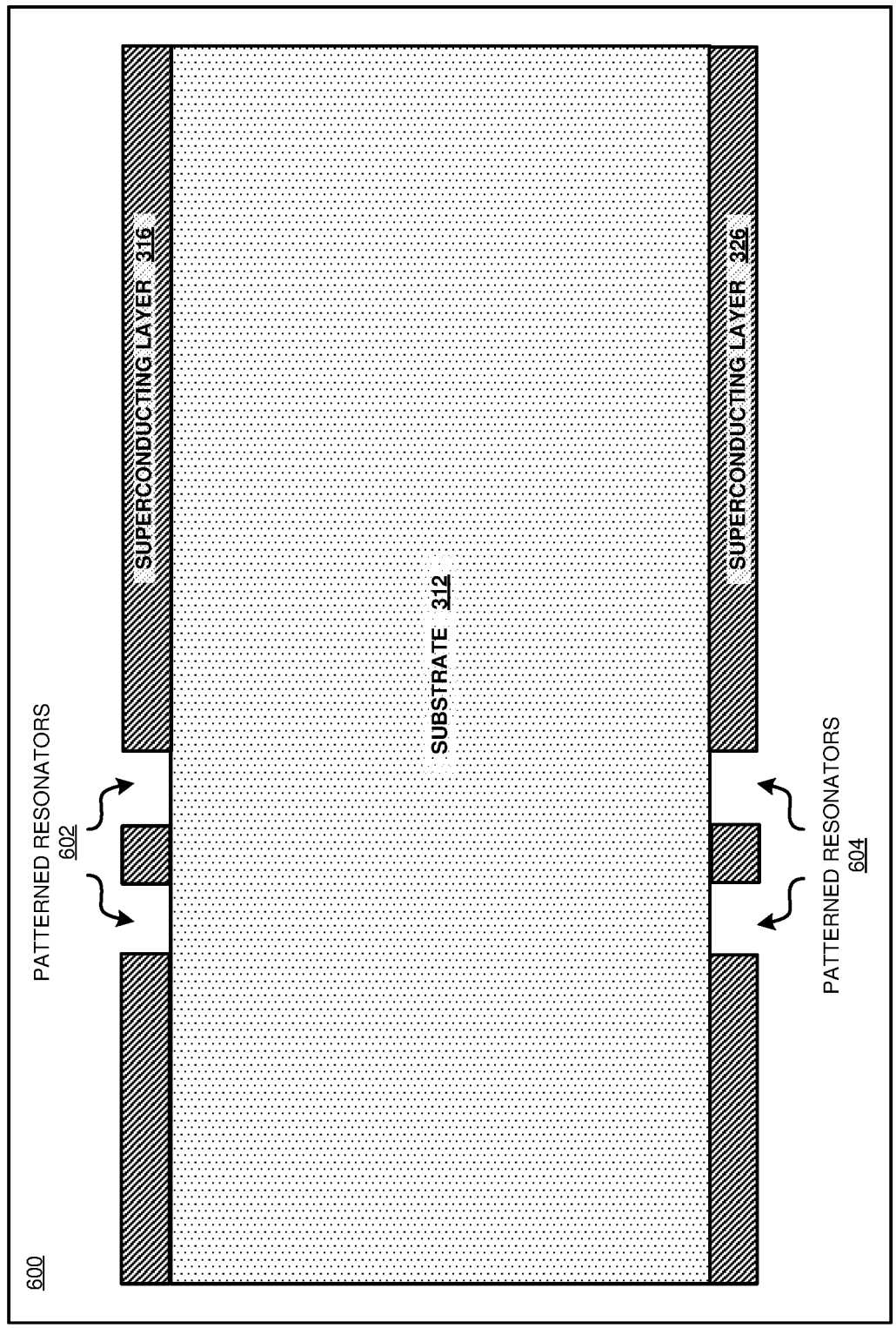
FIG. 6 depicts another step in a fabrication process for through-silicon-via fabrication in planar quantum devices in accordance with an illustrative embodiment.

FIG. 6 depicts another step in a fabrication process for through-silicon-via fabrication in planar quantum devices in accordance with an illustrative embodiment. Substrate 312 and superconducting layers 316 and 326 are the same as substrate 312 and superconducting layers 316 and 326 in FIG. 5.

In particular, FIG. 6 depicts structure 600, including substrate 312 with superconducting layers 316 and 326 deposited thereon. An embodiment has used a patterning process on superconducting layers 316 and 326 to create patterned resonators 602 and 604.

Figure 7:
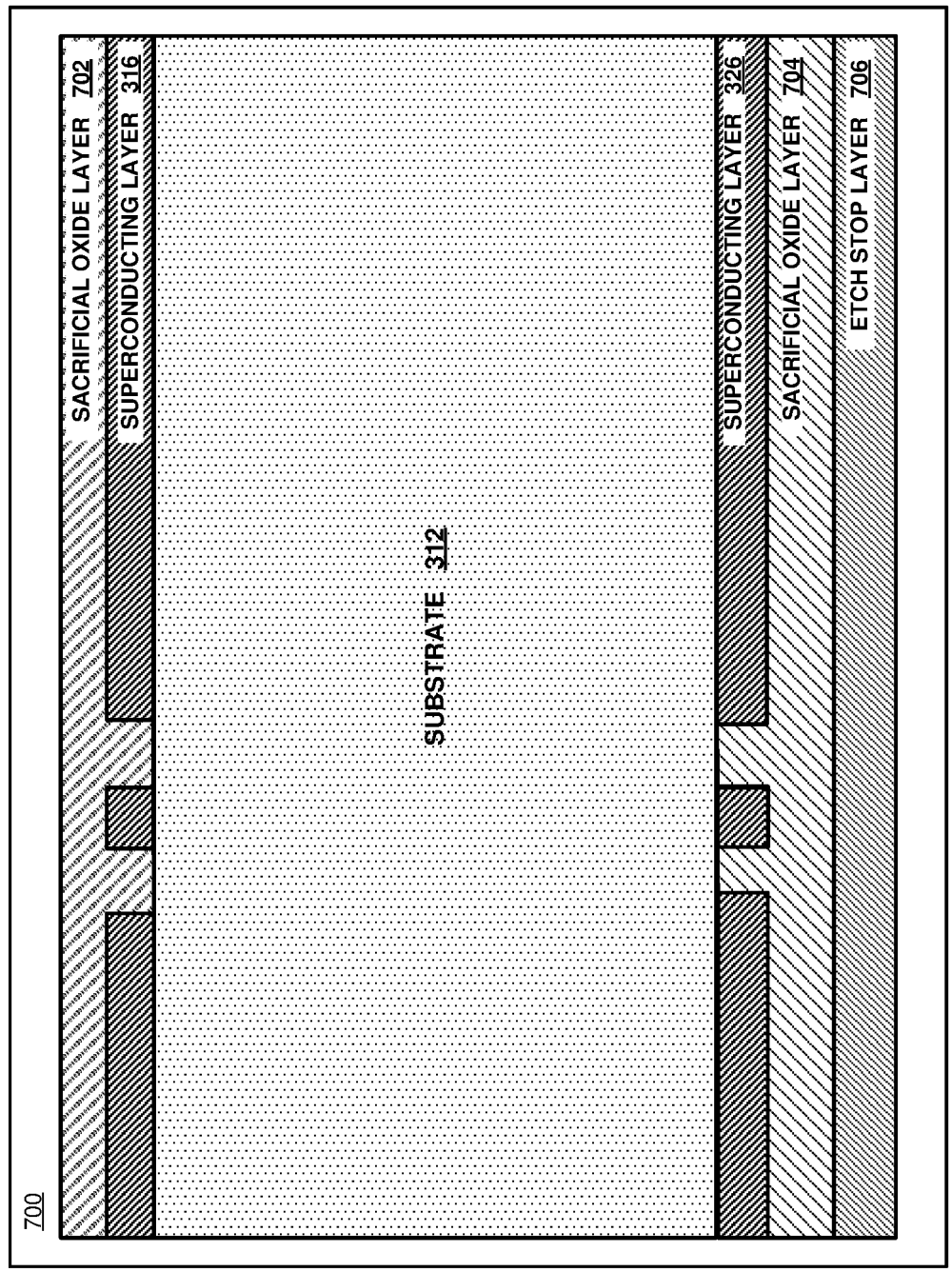
FIG. 7 depicts another step in a fabrication process for through-silicon-via fabrication in planar quantum devices in accordance with an illustrative embodiment.

FIG. 7 depicts another step in a fabrication process for through-silicon-via fabrication in planar quantum devices in accordance with an illustrative embodiment. Substrate 312 and superconducting layers 316 and 326 are the same as substrate 312 and superconducting layers 316 and 326 in FIG. 6.

In particular, FIG. 7 depicts structure 700, including substrate 312 with superconducting layers 316 and 326 deposited thereon. An embodiment has used a deposition process to deposit sacrificial oxide layer 702 on superconducting layer 316. An embodiment has used a deposition process (e.g. low pressure chemical vapor deposition (LPCVD), low temperature chemical vapor deposition (LTCVD), plasma enhanced chemical vapor deposition (PECVD), or atomic layer deposition (ALD)) to deposit sacrificial oxide layer 704 on superconducting layer 326. Sacrificial oxide layers 702 and 704 can be any suitable oxide material, such as a silicon oxide ($SiO_2$). An embodiment has used a deposition process to deposit etch stop layer 706 has been deposited on oxide layer 704. Sacrificial oxide layers 702 and 704 protect superconducting layers 316 and 326 from the effects of later processing steps. Etch stop layer 706 can be any suitable etch stop material, such as silicon nitride (SiN), a doped oxide, or any other material than can be selectively removed. Etch stop layer 706 is optional, but useful to stop a later etching process from proceeding beyond a structure being fabricated.

Figure 8:
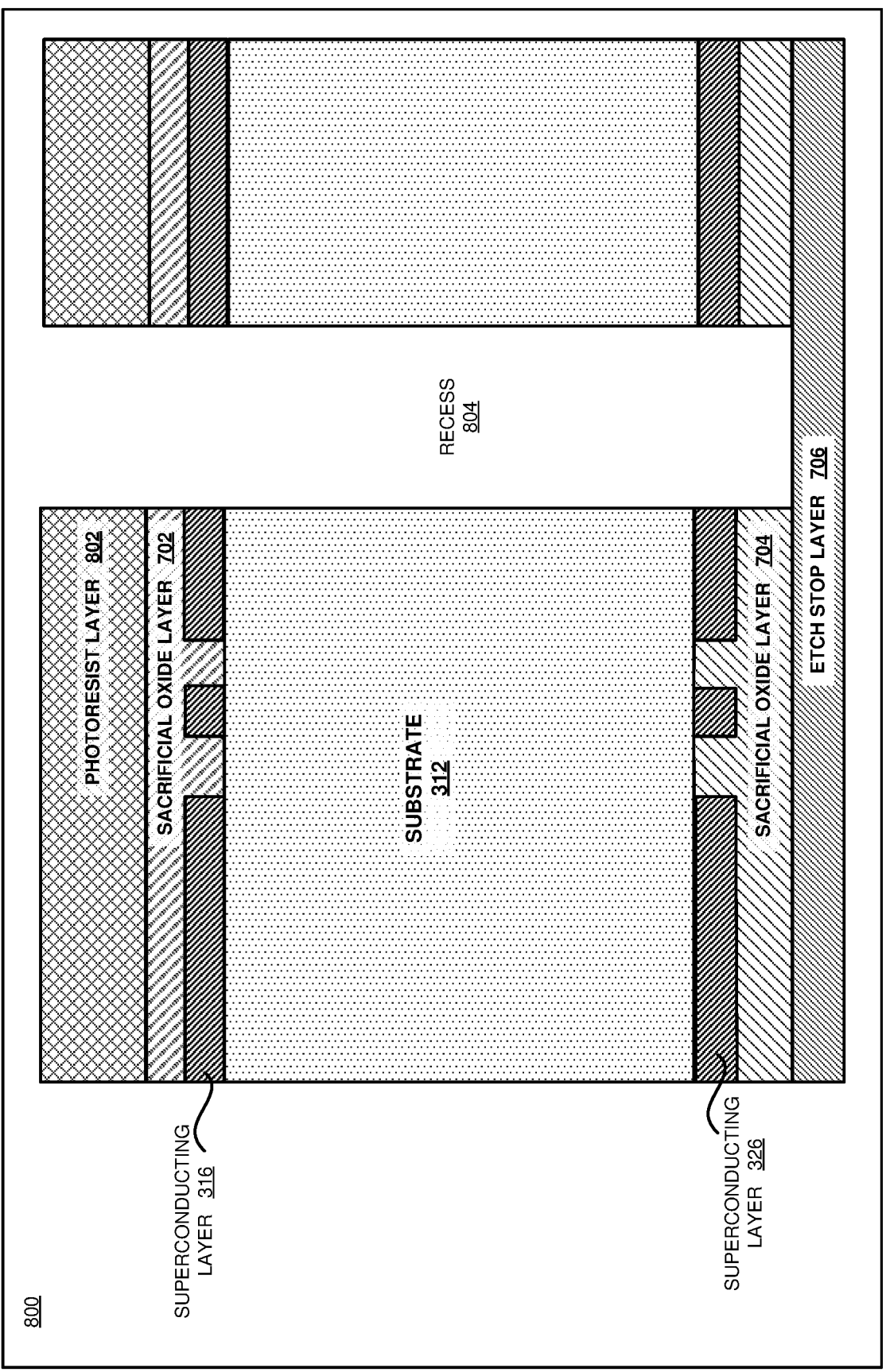
FIG. 8 depicts another step in a fabrication process for through-silicon-via fabrication in planar quantum devices in accordance with an illustrative embodiment.

FIG. 8 depicts another step in a fabrication process for through-silicon-via fabrication in planar quantum devices in accordance with an illustrative embodiment. Substrate 312, superconducting layers 316 and 326, sacrificial oxide layers 702 and 704, and etch stop layer 706 are the same as substrate 312, superconducting layers 316 and 326, sacrificial oxide layers 702 and 704, and etch stop layer 706 in FIG. 7.

In particular, FIG. 8 depicts structure 800. An embodiment has used a deposition process to deposited photoresist layer 802 on a portion of sacrificial oxide layer 702. Photoresist layer 802 is typically spun onto sacrificial oxide layer 702 (i.e. deposited in liquid form and baked). Photoresist layer 802 can be any suitable photoresist material. Although photoresist layer 802 is depicted as only one layer, photoresist layer 802 may include multiple layers, including hard masks (e.g. (oxide, nitride, or metals) or other materials that enable high selectivity and sufficient thickness. For example, a multilayer version of photoresist layer 802 could include a thin photoresist layer on top of an oxide on top of a thick photoresist layer. The thin photoresist layer could be patterned with lithography, the pattern used to etch the oxide, and the oxide used as a mask to etch the thick resist.

Photoresist layer 802 has an opening where a TSV is to be formed. After forming photoresist layer 802 and any additional, optional, etch mask layers, an embodiment has used an etch process to form recess 804 through sacrificial oxide layer 702, superconducting layer 316, substrate 312, sacrificial oxide layer 704, and superconducting layer 326, stopping at etch stop layer 706. The etch process can be any etch process with a chemistry suitable for etching through the necessary depth and the multiple materials present. One general etch process is reactive ion etching (RIE). For deep silicon etching, a suitable etch process is typically a form of the Bosch process (which involves cyclical etching and depositing steps) based on SF6 etching and C4F8 passivation, resulting in an anisotropic etch of silicon.

Figure 9:
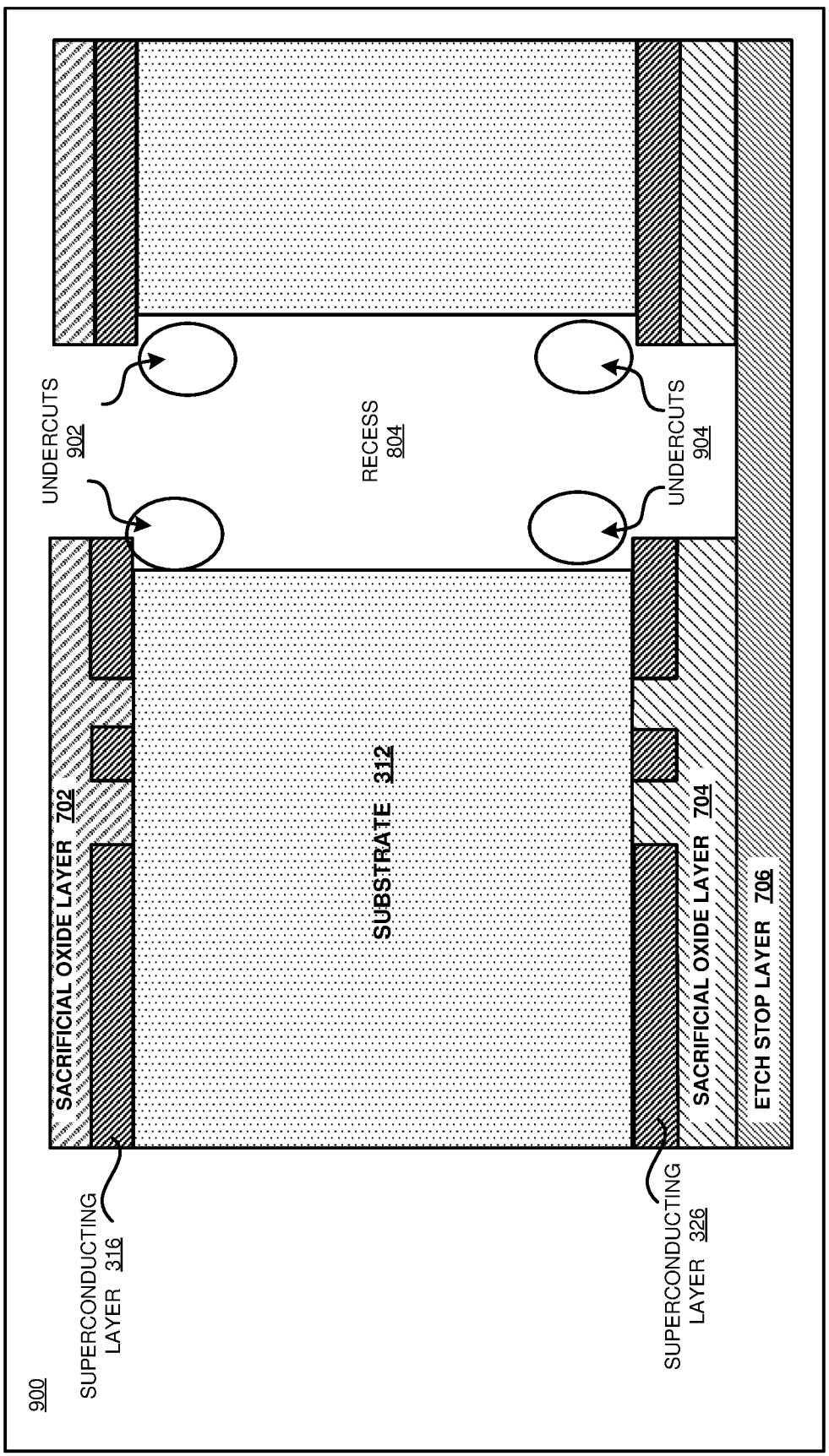
FIG. 9 depicts another step in a fabrication process for through-silicon-via fabrication in planar quantum devices in accordance with an illustrative embodiment.

FIG. 9 depicts another step in a fabrication process for through-silicon-via fabrication in planar quantum devices in accordance with an illustrative embodiment. Substrate 312, superconducting layers 316 and 326, sacrificial oxide layers 702 and 704, recess 804, and etch stop layer 706 are the same as substrate 312, superconducting layers 316 and 326, sacrificial oxide layers 702 and 704, recess 804, and etch stop layer 706 in FIG. 8.

In particular, FIG. 9 depicts structure 900. An embodiment has used an etch process, such as an isotropic silicon dry etch process, to remove photoresist layer 802 from sacrificial oxide layer 702. The etch process can include multiple steps, optionally including wet chemistry, because photoresist removal often requires different chemistry than silicon etching. The etch process has also formed undercuts 902 and 904, expanding recess 804 further into substrate 312 under superconducting layers 316 and 326. Forming undercuts 902 and 904 will protect material deposited within recess 804 from a later anisotropic etching process applied to a planar surface of the structure during fabrication.

Figure 10:
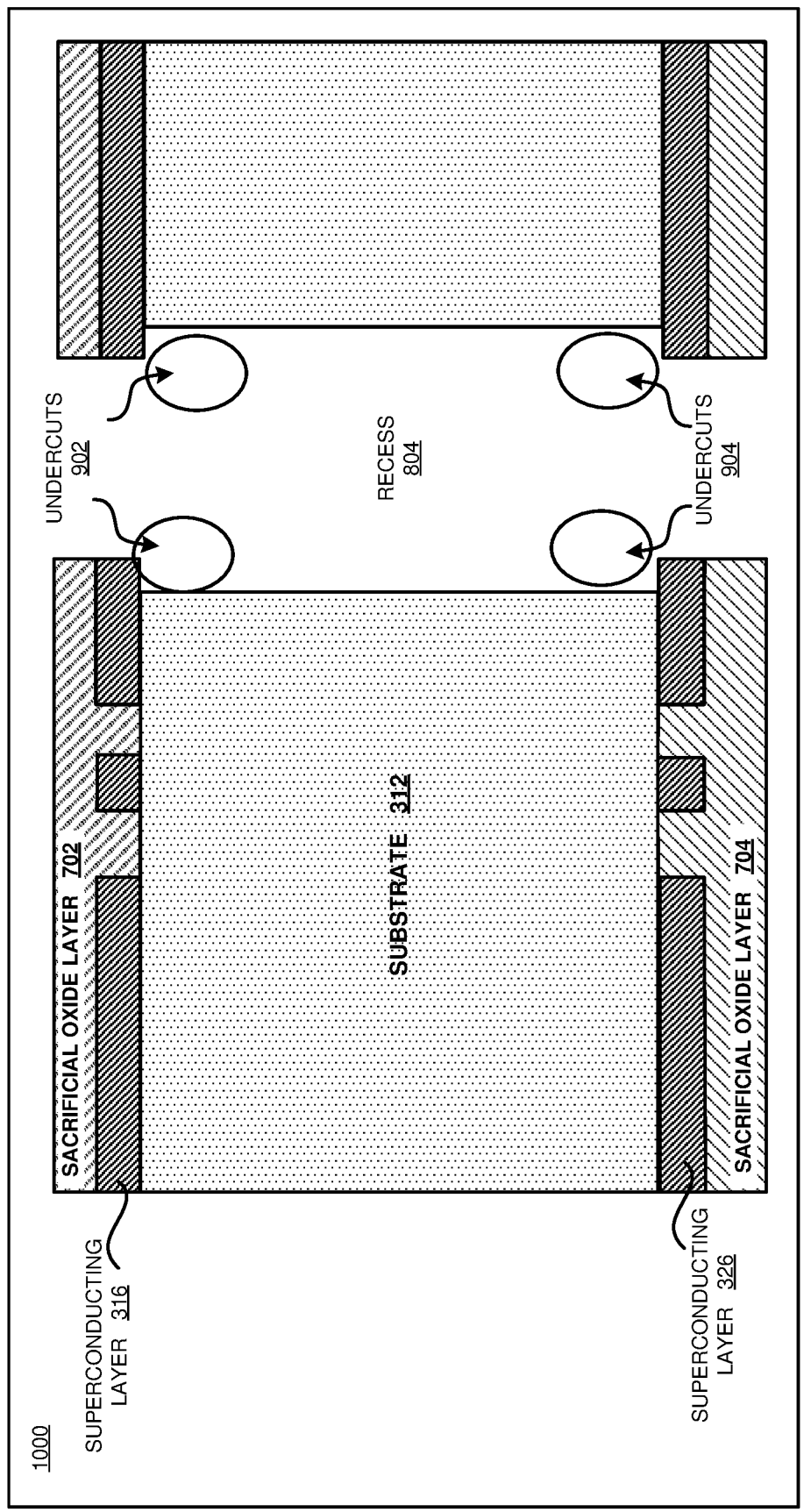
FIG. 10 depicts another step in a fabrication process for through-silicon-via fabrication in planar quantum devices in accordance with an illustrative embodiment.

FIG. 10 depicts another step in a fabrication process for through-silicon-via fabrication in planar quantum devices in accordance with an illustrative embodiment. Substrate 312, superconducting layers 316 and 326, sacrificial oxide layers 702 and 704, recess 804, and undercuts 902 and 904 are the same as substrate 312, superconducting layers 316 and 326, sacrificial oxide layers 702 and 704, recess 804, and undercuts 902 and 904 in FIG. 9.

In particular, FIG. 10 depicts structure 1000. As shown, an embodiment has removed etch stop layer 706 from sacrificial oxide layer 704. To remove etch stop layer 706, an embodiment can be configured to use a wet etch or a dry etch process. For example, phosphorus is a typical chemistry for selectively wet etching SiN in relation to oxide and silicon.

Figure 11:
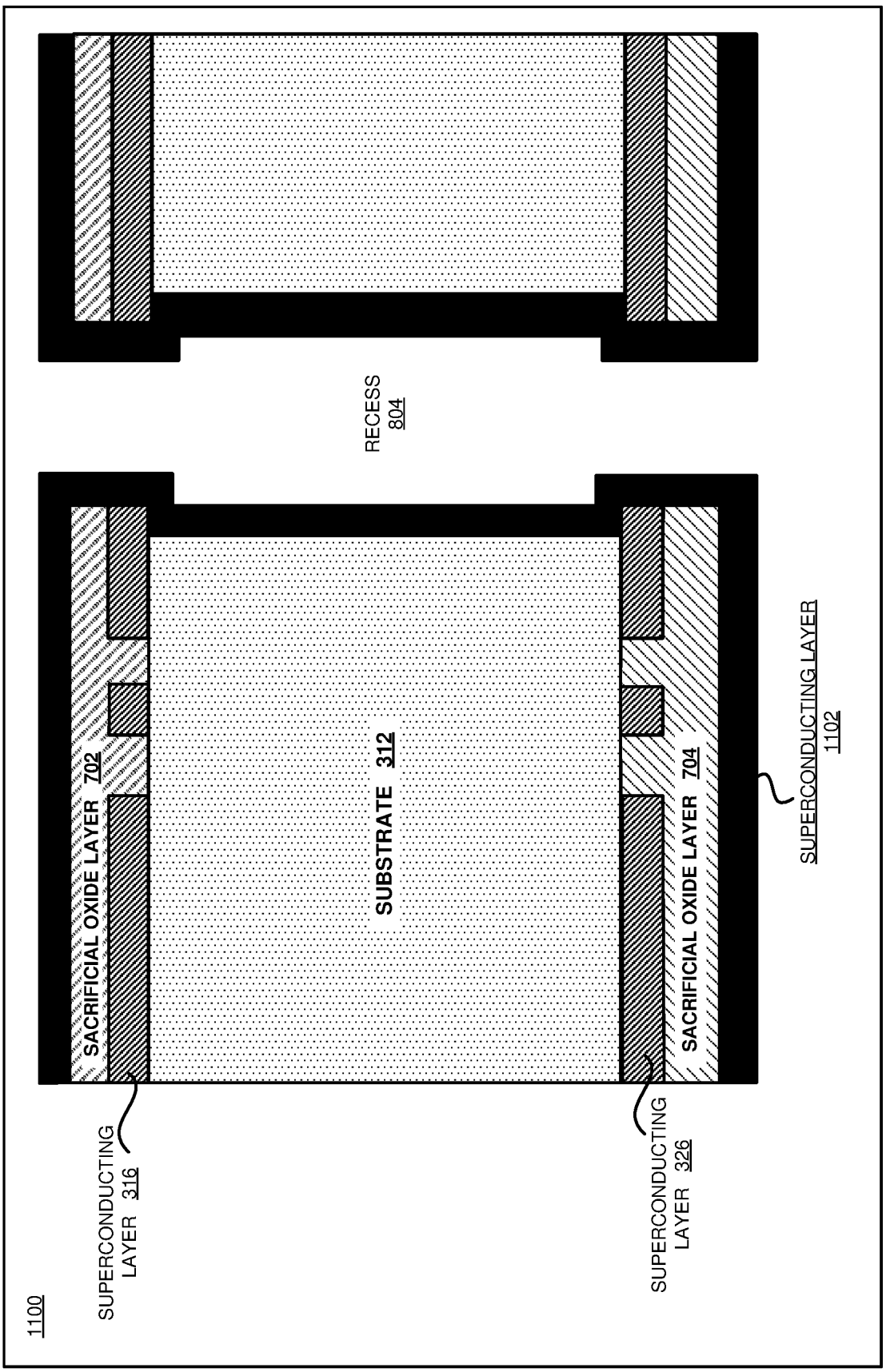
FIG. 11 depicts another step in a fabrication process for through-silicon-via fabrication in planar quantum devices in accordance with an illustrative embodiment.

FIG. 11 depicts another step in a fabrication process for through-silicon-via fabrication in planar quantum devices in accordance with an illustrative embodiment. Substrate 312, superconducting layers 316 and 326, sacrificial oxide layers 702 and 704, and recess 804 are the same as substrate 312, superconducting layers 316 and 326, sacrificial oxide layers 702 and 704, and recess 804 in FIG. 10.

In particular, FIG. 11 depicts structure 1100. An embodiment has used a deposition process, such as atomic layer deposition (ALD), physical vapor deposition (PVD), or chemical vapor deposition (CVD), to deposit superconducting layer 1102 on sacrificial oxide layers 702 and 704 and the interior of recess 804. The deposition process can also be performed from both sides of substrate 312. Alternatively, layer 1102 could be deposited at an earlier stage after the undercut depicted in FIG. 9. Superconducting layer 1102 can be TiN, or another superconducting material. In addition, superconducting layer 1102 can be the same or a different material as superconducting layers 316 and 326.

Figure 12:
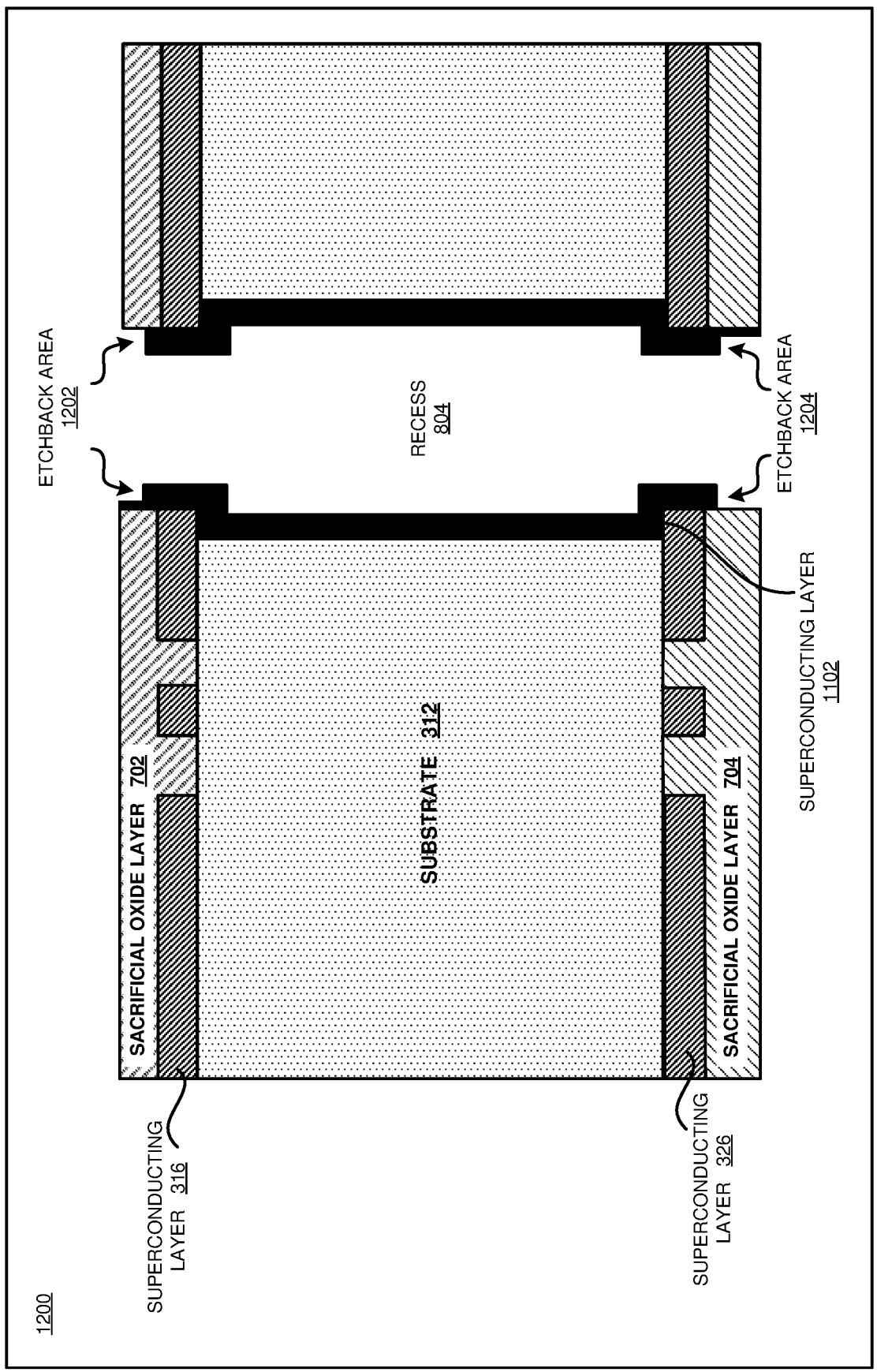
FIG. 12 depicts another step in a fabrication process for through-silicon-via fabrication in planar quantum devices in accordance with an illustrative embodiment.

FIG. 12 depicts another step in a fabrication process for through-silicon-via fabrication in planar quantum devices in accordance with an illustrative embodiment. Substrate 312, superconducting layers 316 and 326, sacrificial oxide layers 702 and 704, superconducting layer 1102, and recess 804 are the same as substrate 312, superconducting layers 316 and 326, sacrificial oxide layers 702 and 704, superconducting layer 1102, and recess 804 in FIG. 11.

In particular, FIG. 12 depicts structure 1200. An embodiment has used an etch process to remove portions of superconducting layer 1102 from sacrificial oxide layers 702 and 704, extending into etchback areas 1202 and 1204 and electrically coupling or connecting superconducting layers 316 and 326 to superconducting layer 1102 to form a TSV in the area of recess 804. Performing the etchback with sacrificial oxide layers 702 and 704 in place prevents etching into superconducting layers 316 and 326, keeping superconducting layers 316 and 326 substantially planar even though the etchback area may be slightly above or below the planar region.

Figure 13:
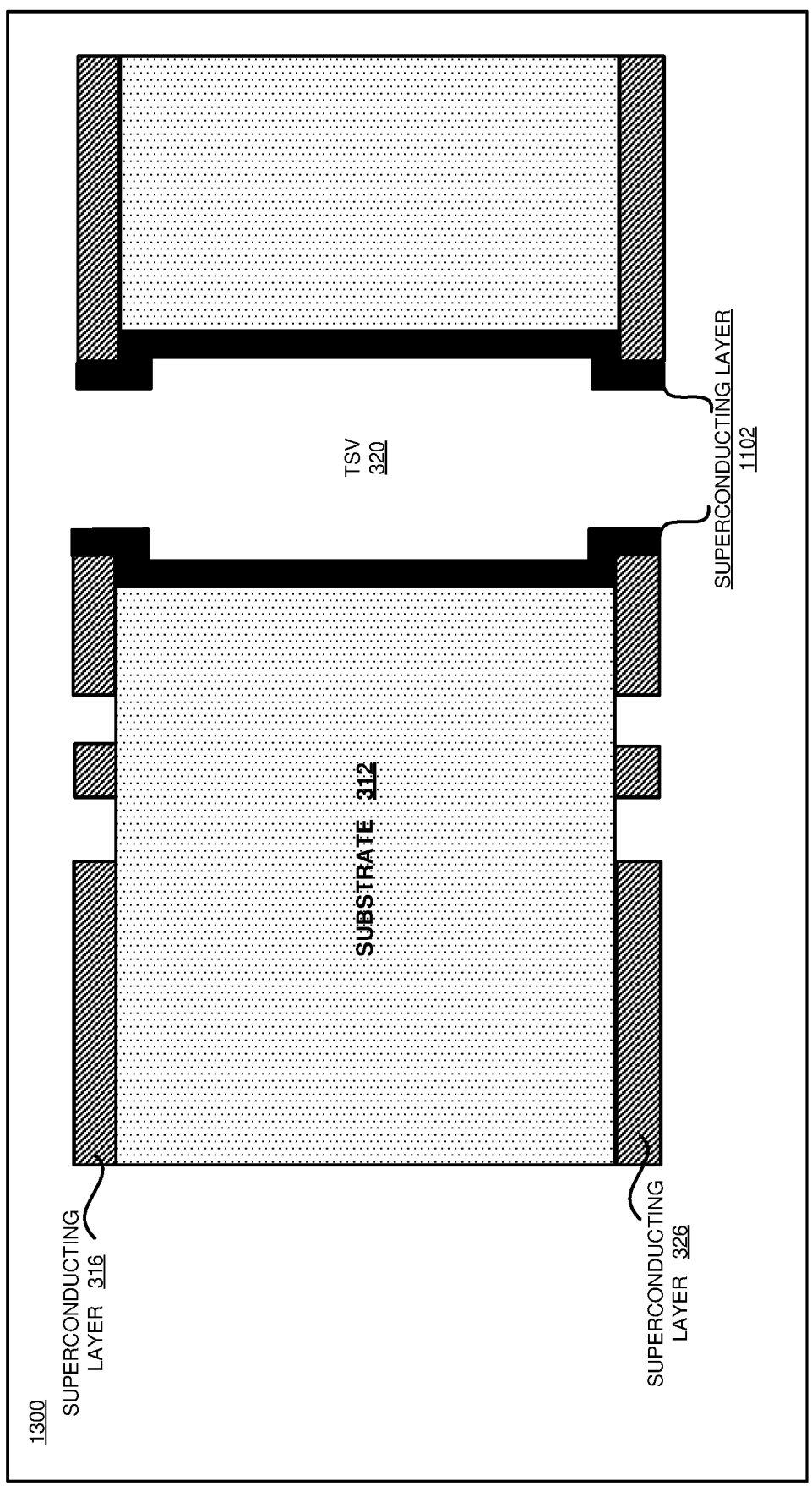
FIG. 13 depicts another step in a fabrication process for through-silicon-via fabrication in planar quantum devices in accordance with an illustrative embodiment.

FIG. 13 depicts another step in a fabrication process for through-silicon-via fabrication in planar quantum devices in accordance with an illustrative embodiment. Substrate 312, superconducting layers 316 and 326, and superconducting layer 1102 are the same as substrate 312, superconducting layers 316 and 326 and superconducting layer 1102 in FIG. 12. TSV 320 is the same as TSV 320 in FIG. 3 and FIG. 4.

In particular, FIG. 13 depicts structure 1300. An embodiment has used a process, such as a wet etch (e.g. a buffered oxide etch) process, or a dry process followed by a wet etch, to remove sacrificial oxide layers 702 and 704, exposing superconducting layers 316 and 326 for a later process such as qubit junction fabrication.

In a further fabrication step (not shown), TSV 320 could be filled partially or completely. Filling with a polymer, insulator, or metal (e.g. copper) is contemplated, as long as superconducting layer 1102 lining TSV 320 is sufficiently thick to be unaffected by the presence of the non-superconducting filler material. Filling can also performed at an earlier stage in the fabrication process, such as after undercuts 902 and 904 are formed or without forming undercuts 902 and 904, by depositing superconducting layer 1102 and then filling the remainder of TSV 320, and planarizing or etching back the filler.

Figure 14:
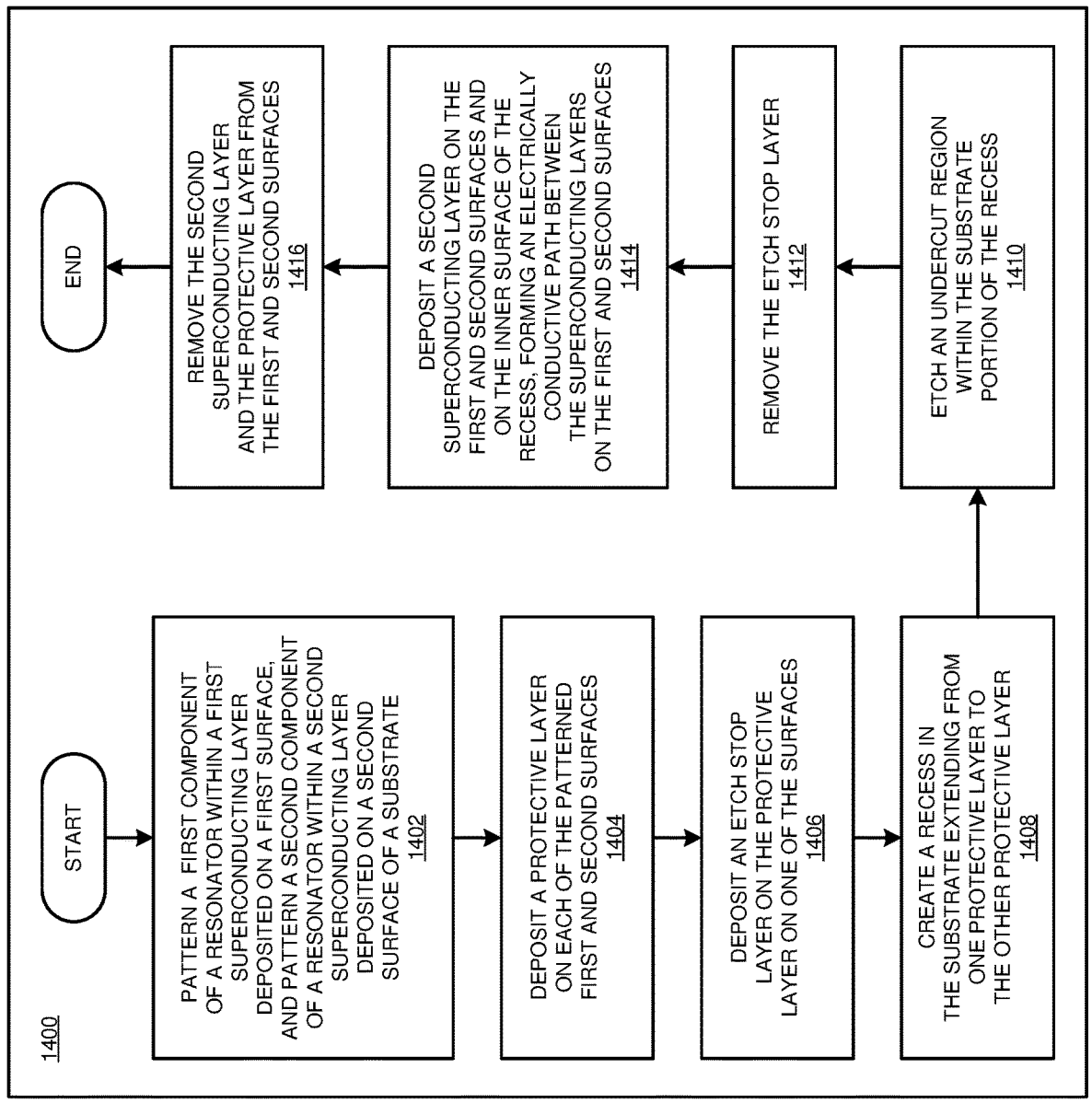
FIG. 14 depicts a flowchart of an example process for through-silicon-via fabrication in planar quantum devices in accordance with an illustrative embodiment.

FIG. 14 depicts a flowchart of an example process for through-silicon-via fabrication in planar quantum devices in accordance with an illustrative embodiment. Process 1400 can be implemented in application 205 in FIG. 2.

In block 1402, the application patterns a first component of a resonator within a first superconductor layer deposited on a first surface, and patterns a second component of a resonator within a second superconductor layer deposited on a second surface. In block 1404, the application deposits a protective layer on each of the patterned first and second surfaces. In block 1406, the application deposits an etch stop layer on the protective layer on one of the surfaces. In block 1408, the application creates a recess in the substrate extending from one protective layer to the other protective layer. In block 1410, the application etches an undercut region with the substrate portion of the recess. In block 1412, the application removes the etch stop layer. In block 1414, the application deposits a second superconducting layer on the first and second surfaces and on the inner surface of the recess, forming an electrically conductive path between the superconducting layers on the first and second surfaces. In block 1416, the application removes the second superconducting layer and the protective layer from the first and second surfaces. Then the application ends.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   patterning, on a first superconducting layer deposited on a first surface of a substrate, a first component of a resonator;
   patterning, on a second superconducting layer deposited on a second surface of the substrate, a second component of the resonator, wherein the first surface and the second surface are disposed relative to each other in a non-co-planar disposition;
   creating, in the substrate, a recess, the recess extending from the first superconducting layer to the second superconducting layer;
   depositing, on an inner surface of the recess, a third superconducting layer, the third superconducting layer forming a superconducting path between the first superconducting layer and the second superconducting layer;
   removing, from the first surface and the second surface, forming a completed through-silicon via (TSV), excess material of the third superconducting layer.

2. The method of claim 1, further comprising:
   depositing, on the patterned first surface, a first protective layer;
   depositing on the patterned second surface, a second protective layer; and
   performing the creating such that the recess extends from the first protective layer to the second protective layer.

3. The method of claim 2, wherein the first protective layer comprises an oxide layer.

4. The method of claim 2, further comprising:
   etching, within a substrate portion of the recess, an undercut region, wherein a diameter of the undercut region is greater than a diameter of the recess at the first superconducting layer.

5. The method of claim 4, wherein the etching is performed using an isotropic silicon dry etch process.

6. The method of claim 4, further comprising:
   depositing, on the second protective layer prior to creating the recess, an etch stop layer; and
   removing, from the second protective layer after etching the undercut region, the etch stop layer.

7. The method of claim 6, wherein the etch stop layer comprises a silicon nitride layer.

8. The method of claim 2, further comprising:
   further depositing the third superconducting layer on the first protective layer and the second protective layer.

9. The method of claim 8, further comprising:
   further removing the third superconducting layer from the first protective layer and the second protective layer.

10. The method of claim 2, further comprising:
    further removing, from the first patterned surface and the second patterned surface, the first protective layer and the second protective layer.

11. The method of claim 10, further comprising:
    etching, prior to removing the first protective layer and the second protective layer, a portion of the third superconducting layer, the portion occupying the recess in the protective layer.

12. The method of claim 1, wherein each of the first superconducting layer, the second superconducting layer, and the third superconducting layer, comprises a titanium nitride layer.

13. The method of claim 1, wherein the removing uses an etching process.

14. The method of claim 1, wherein the completed TSV is a hollow superconductor.

15. The method of claim 1, wherein the first component of the resonator is an inductive element, and wherein the inductive element and a qubit are disposed on the same surface.

16. The method of claim 1, wherein the first component of the resonator is a capacitive element, and wherein the capacitive element and a qubit are disposed on the same surface.

17. The method of claim 1, wherein the first component of the resonator is a conductive pad, wherein the conductive pad and a qubit are disposed on the same surface, and wherein an inductive element and a capacitive element of the resonator are disposed on the opposite surface.

* * * * *